(12) United States Patent
Tian et al.

(10) Patent No.: US 7,218,148 B2
(45) Date of Patent: May 15, 2007

(54) TRACKING UNITY GAIN FOR EDGE RATE AND TIMING CONTROL

(75) Inventors: Yanmei Tian, Sunnyvale, CA (US); Yanbin Wang, Saratoga, CA (US); Mubeen Atha, Sunnyvale, CA (US); Harry Muljono, Union City, CA (US)

(73) Assignee: Intel Corporation, Santa Clara, CA (US)

( * ) Notice: Subject to any disclaimer, the term of this patent is extended or adjusted under 35 U.S.C. 154(b) by 178 days.

(21) Appl. No.: 10/999,781

(22) Filed: Nov. 30, 2004

(65) Prior Publication Data

US 2006/0114026 A1 Jun. 1, 2006

(51) Int. Cl.
*H03K 19/0175* (2006.01)
*H03K 5/12* (2006.01)
*H03K 17/14* (2006.01)

(52) U.S. Cl. .......................... 326/82; 326/31; 327/108; 327/378

(58) Field of Classification Search ................ 326/82, 326/29, 86, 31, 32, 83; 327/108, 170, 378, 327/512, 83
See application file for complete search history.

(56) References Cited

U.S. PATENT DOCUMENTS 6,043,682 A 3/2000 Dabral et al.
6,051,998 A * 4/2000 Lee et al. ..................... 327/59

OTHER PUBLICATIONS

Konstadinidis, Georgios, et al., "Implementation of a Third-Generation 1.1GHz 64b Microprocessor", *ISSCC 2002/ Session 20/ Microprocessors/20.3*, ISSCC 2002 Visuals Supplement /IEEE, (2002), 3 pgs.
Muljono, Harry, et al., "A 400MT/s 6.4GB/s Multiprocessor Bus Interface", *ISSCC 2003/ Session 19/ Processor Building Blocks/ Paper 19.3*, 2003 IEEE International Solid-State Circuits Conference, (2003), 8 pgs.

* cited by examiner

*Primary Examiner*—Daniel Chang
(74) *Attorney, Agent, or Firm*—Douglas J. Ryder; Ryder IP Law, PC (57) ABSTRACT

In general, in one aspect, the disclosure describes an apparatus for calibrating signals. The apparatus includes a unity gain detector to traverse a gain curve of an output buffer circuit to determine unity gain voltages associated with unity gain crossover points on an input voltage ramp. The apparatus further includes a pre-boost circuit to apply the unity gain voltages to at least one input/output buffer within the output buffer circuit.

15 Claims, 10 Drawing Sheets

TRACKING UNITY GAIN FOR EDGE RATE AND TIMING CONTROL

BACKGROUND

Output buffers hold data awaiting transmission. The output buffers transmit the data upon receipt of an appropriate signal. The buffers may provide the data to terminals, pads, transmission lines, busses, traces, receiving circuits, etc. (referred to generally hereinafter as "receiving components").

One critical property of the output buffer is the non-linearity of its output response characteristic. When a linear input (e.g., voltage ramp) is applied to an input an output gain is not constant. The linear input may be provided by a transistor (e.g., pull up transistor). The non linear output gain often has one or more low gain regions separated by a high gain region. Crossovers between the low gain and high gain regions is where the gain is equal to one and is known as Unity Gain (UG). Pre-boosting and post-boosting take advantage of the non linear gain property by rapidly transitioning the input in the low gain region and exerting edge rate control in the high gain territory.

As pre-boosting and post-boosting are dependent on transitions between low and high gain regions a determination of the crossover between these regions is desired (e.g., determination of UG). However, UG may fluctuate, for a number of reasons, and is usually process, voltage and temperature (PVT) dependant. Pre-boosting to the correct UG results in balanced falling and rising transitions. Over pre-boosting speeds up the output transition because the high gain region is encroached before UG, while under pre-boosting slows down the output transition because it takes time for edge rate control to drive past the UG.

One method for pre-boosting includes use of a self-timed circuit. When the input transitions, the pullup leg of the transistor is enabled for a time delay provided by an inverter chain. The preboosted level depends on the node capacitance C at the output, the strength of the pullup/pulldown legs and the time delay. None of these parameters are PVT compensated. As a result, under or over pre-boosting may occur as process, voltage and temperature vary. The under or over pre-boosting causes unbalanced falling and rising transition at the output.

BRIEF DESCRIPTION OF THE DRAWINGS

The features and advantages of the various embodiments will become apparent from the following detailed description in which.

DETAILED DESCRIPTION

Figure 1:
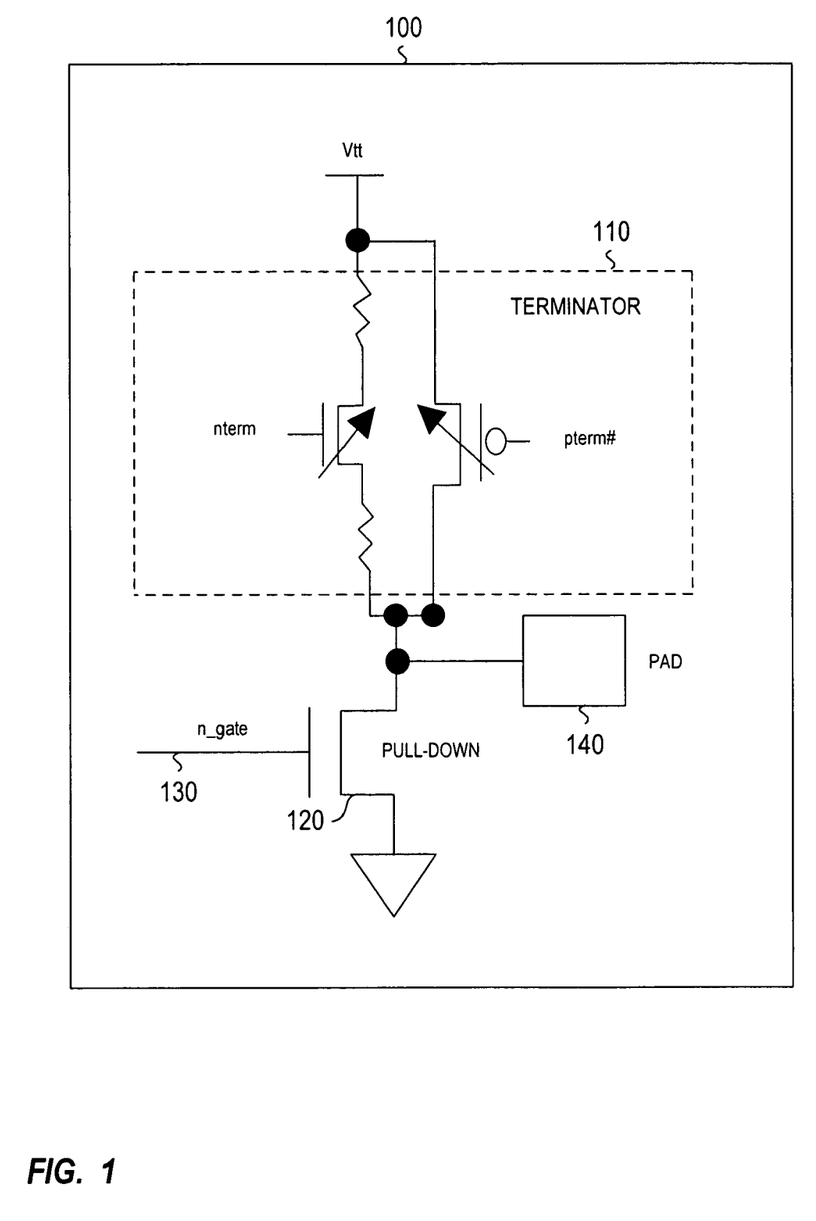
FIG. 1 illustrates an exemplary output buffer circuit, according to one embodiment.

FIG. 1 illustrates an exemplary output buffer circuit 100. The output buffer circuit 100 includes a terminator 110 and a pull down transistor 120. An input (e.g., voltage ramp) is applied to n_gate 130 and an output (e.g., voltage) is provided at PAD 140. As the voltage applied to the n_gate 130 is increased the voltage at the PAD 140 is decreased. The gain of the buffer is based on changes in the input n_gate 130 ($\delta V_{in}$) and changes in the output PAD 140 ($\delta V_{out}$). The gain is measured as the change in PAD 140 divided by the change in n_gate 130 ($\delta V_{out}/\delta V_{in}$). The buffer circuit 120 described is a Gunning Transceiver Logic (GTL) buffer having an open drain (e.g., only has n-gate). A p-gate may be added to improve signal integrity (GTL+buffer). The p-gate won't affect buffer timing and edge-rate.

Figure 2:
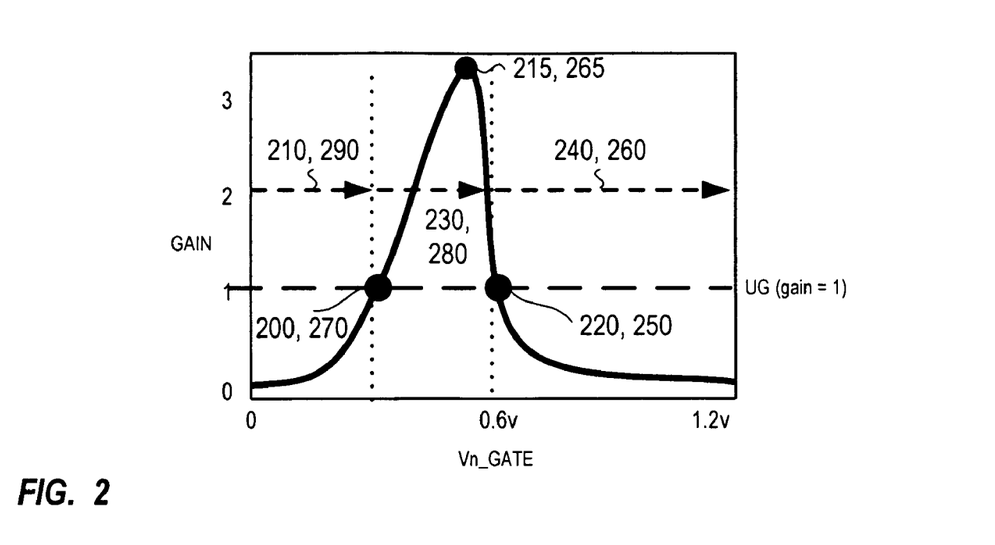
FIG. 2 illustrates an exemplary gain curve of an output buffer circuit, according to one embodiment.

FIG. 2 illustrates an exemplary output buffer gain characteristic. The voltage applied to the n_gate ($V_{n\_gate}$) is plotted on the x-axis and the gain is plotted on the y-axis. As illustrated, as $V_{n\_gate}$ increases (rising edge) the gain increases and crosses over unity gain (UG) at a first crossover point 200 of approximately 0.3 V. The $V_{n\_gate}$ below approximately 0.3 V (the first crossover point 200) produces a gain of less than UG (first low gain region 210). As the $V_{n\_gate}$ increases from approximately 0.3 V (the first crossover point 200) the gain continues to increase until it reaches a maximum gain 215 at approximately 0.5 V. As the $V_{n\_gate}$ continues to increase from approximately 0.5 V (the maximum gain 215) the gain begins to decrease and crosses over the UG at a second crossover point 220 of approximately 0.6 V. The $V_{n\_gate}$ between 0.3 V (the first crossover point 200) and 0.6V (the second crossover point 220) produces a gain of greater than UG (a high gain region 230). As the $V_{n\_gate}$ continues to increase from approximately 0.6 V (the second crossover point 220) the gain continues to decrease. The $V_{n\_gate}$ above 0.6 V (the second crossover point 220) produces a gain of less than UG (a second low gain region 240).

Figure 3:
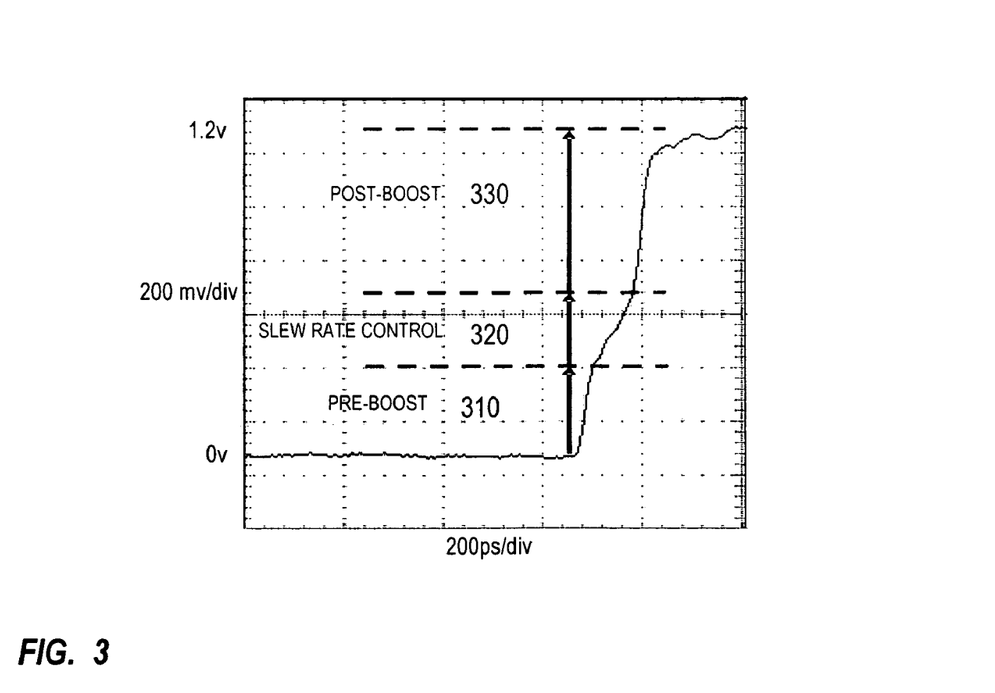
FIG. 3 illustrates an exemplary voltage ramp applied to an output buffer circuit, according to one embodiment.

FIG. 3 illustrates an exemplary low to high voltage ramp applied to n_gate ($V_{n\_gate}$) corresponding to the exemplary output buffer gain characteristic of FIG. 2. The voltage ramp goes from approximately 0 V to 1.2 V. To take advantage of the gain properties of the output buffer, pre-boosting 310 can be applied until the $V_{n\_gate}$ is approximately 0.3 V (the first low gain region 210 of FIG. 2). Slew rate control 320 can be applied from approximately 0.3 V to 0.6 V (the high gain region 230 of FIG. 2). Post-boosting 330 can be applied above 0.6 V until approximately 1.2 V (the second low gain region 240 of FIG. 2).

FIGS. 2 and 3 focused on the UG crossover points as $V_{n\_gate}$ transitions from low to high (rising edge). As one of ordinary skill in the art would recognize UG crossover points would also be applicable for the high to low transitions (falling edge) of $V_{n\_gate}$. For example, for a high to low $V_{n\_gate}$ transition the exemplary gain characteristic chart of FIG. 2 would be read from right to left. As the $V_{n\_gate}$ decreases from a maximum of approximately 1.2 V, the gain increases. The gain crosses over UG at a first crossover point 250 of approximately 0.6 V. The $V_{n\_gate}$ above approximately 0.6 V (the first crossover point 250) produces a gain of less than UG (first low gain region 260). As the $V_{n\_gate}$ decreases from approximately 0.6 V (the first crossover point 250) the gain continues to increase until it reaches a maximum gain 265 at approximately 0.5 V. As the $V_{n\_gate}$ continues to decrease from approximately 0.5 V (the maximum gain 265) the gain begins to decrease and crosses over the UG at a second crossover point 270 of approximately 0.3 V. The V $V_{n\_gate}$ between 0.3 V (the first crossover point 250) and 0.6V (the second crossover point 270) produces a gain of greater than UG (a high gain region 280). The $V_{n\_gate}$ below 0.3 V (the second crossover point 270) produces a gain of less than UG (a second low gain region 290).

The UG crossover points 200, 220, 250, 270 may vary as process, voltage and temperature (PVT) vary for the output buffer circuit. The first UG crossover points 200 (low to high transition of $V_{n\_gate}$), and 250 (high to low transitions of $V_{n\_gate}$) can be determined by traversing the gain curve and locating points where $\delta V_{out}$ becomes equal to or greater than $\delta V_{in}$.

Figure 4:
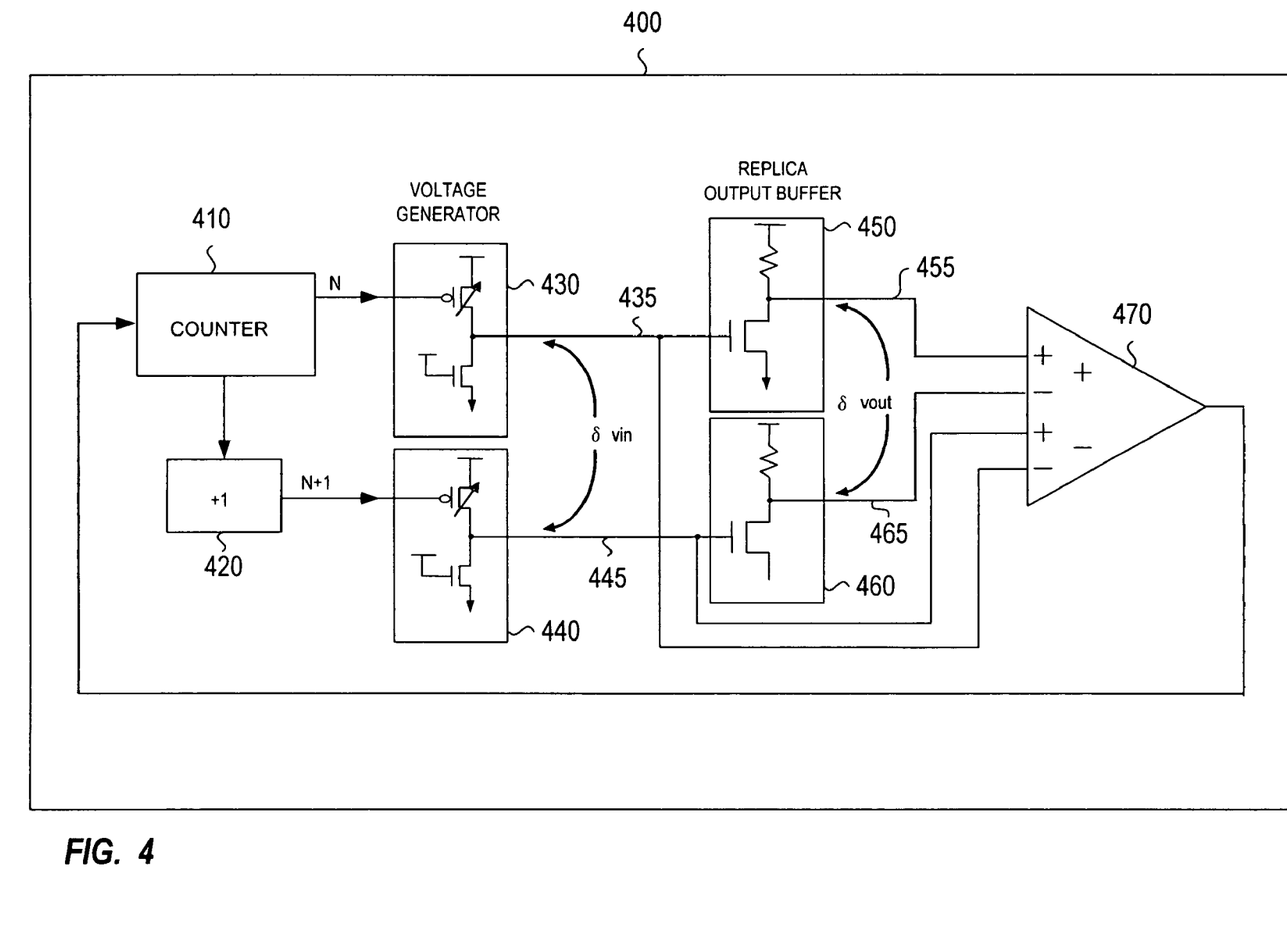
FIG. 4 illustrates an exemplary circuit for determining UG crossover points, according to one embodiment.

FIG. 4 illustrates an exemplary circuit 400 for determining UG crossover points. The circuit 400 includes a counter 410, an adder 420, two identical voltage generators 430, 440, two identical output buffers 450, 460 and a four input differential amplifier 470. The counter 410 and adder 420 produce "N" and "N+1" values which are used as inputs to the two identical voltage generators 430, 440. A first voltage generator 430 generates a first input voltage ($V_{in(N)}$) 435 and a second voltage generator 440 generates a second input voltage ($V_{in(N+1)}$) 445. The difference between $V_{in(N)}$ 435 and $V_{in(N+1)}$ 445 is $\delta V_{in}$. For rising edges of $V_{in}$ (low to high transition), the counter 410 starts with low numbers (e.g., 0) and as the number for the counter 410 and the adder 420 increase the voltage generators 430, 440 generate higher $V_{in(N)}$ 435 and $V_{in(N+1)}$ 445. Ideally the voltage generators 430, 440 have linear characteristic so the relation between the counter 410 and the $V_{in(N)}$ 435 as well as the adder 420 and the $V_{in(N+1)}$ 445 will also be linear and $\delta V_{in}$ will be constant. However, even if the voltage generators 430, 440 are not linear (which may be true over a wide range) the counter 410 and the adder 420 will still equate to certain voltages, but the increments will not be linear and $\delta V_{in}$ will not be constant.

The $V_{in(N)}$ 435 is feed to a first output buffer 450 and the $V_{in(N+1)}$ 445 is feed to a second output buffer 460. The first output buffer 450 generates a first output voltage ($V_{out(N)}$) 455 and the second output buffer 460 generates a second output voltage ($V_{out(N+1)}$) 465. The difference between the $V_{out(N)}$ 455 and the $V_{out(N+1)}$ 465 is $\delta V_{out}$. As the $V_{in(N)}$ 435 and $V_{in(N+1)}$ 445 increase the $V_{out(N)}$ 455 and the $V_{out(N+1)}$ 465 accordingly decrease. The four outputs 435, 445, 455, 465 are fed into the four input differential amplifier 470 for comparison. The differential amplifier 470 compares $\delta V_{out}$ to $\delta V_{in}$ to determine when UG has been reached (when $\delta V_{out}$ is greater than or equal to $\delta V_{in}$). When $\delta V_{out}$ is greater than $\delta V_{in}$ the output of the differential amplifier 470 switches (e.g., switches to "1") and the counter 410 stops counting up. The number "N+1" is recorded as this is the number corresponding to the actual input voltage that generated UG (point at which gain became greater than or equal to one). N+1 is fed into all I/O buffers to re-generate the UG buffer input voltage (to be discussed in more detail with respect to FIGS. 7 and 8). By comparing $\delta V_{in}$ and $\delta V_{out}$ of the buffer, the circuit detects the UG point of the buffer independent of PVT.

Figure 5:
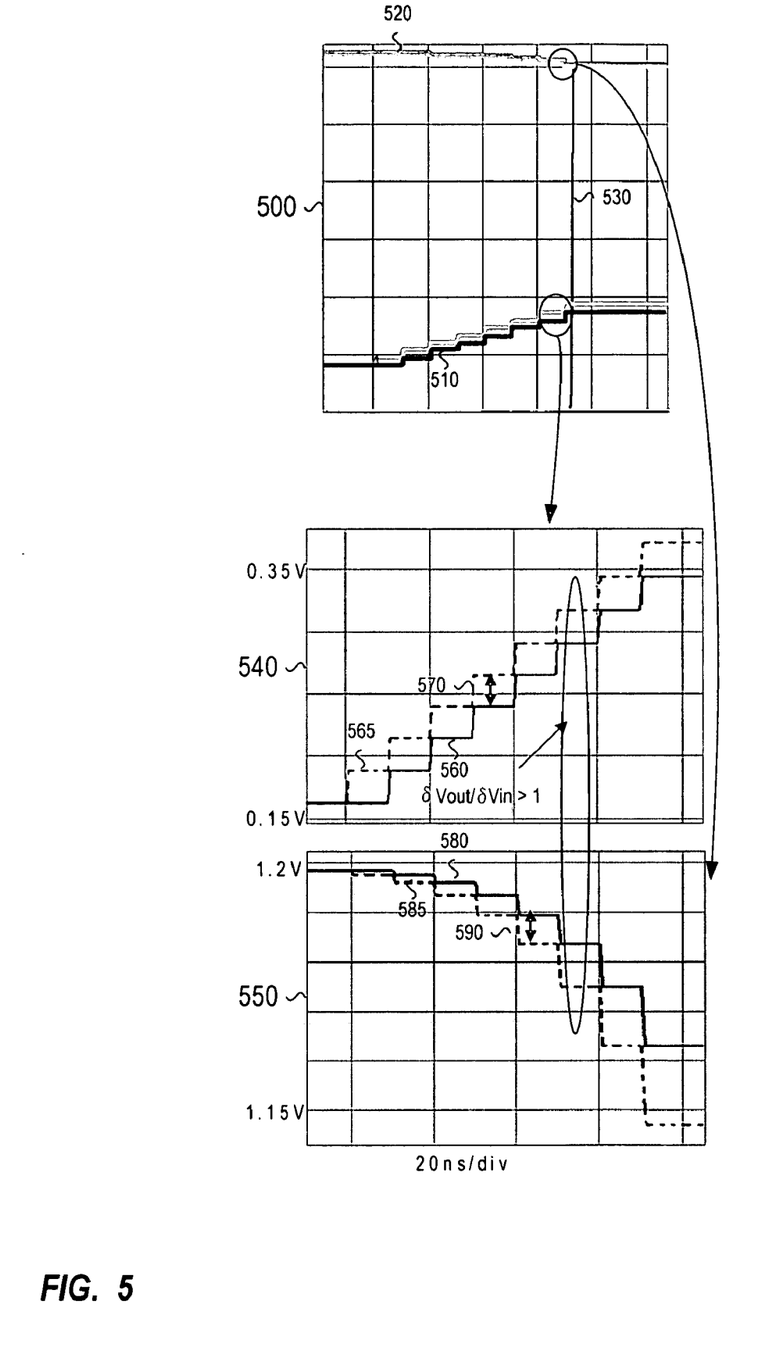
FIG. 5 illustrates an exemplary rising edge (low to high transition) of $V_{in}$ and corresponding falling edge (high to low transition) of $V_{out}$, according to one embodiment.

FIG. 5 illustrates an exemplary rising edge (low to high transition) of $V_{in}$ and corresponding falling edge (high to low transition) of $V_{out}$ for circuit 400. An upper graph 500 illustrates $V_{in}$ 510 ($V_{in(N)}$ 435 and $V_{in(N+1)}$ 445 of FIG. 4) increasing and $V_{out}$ 520 ($V_{out(N)}$ 455 and $V_{out(N+1)}$ 465 of FIG. 4) decreasing. It also illustrates a differential amplifier signal 530 switching from "0" to "1" at a point when $\delta V_{out}$ is greater than or equal to $\delta V_{in}$. Middle graph 540 is a zoomed in portion of $V_{in}$ 510 and lower graph 550 is a zoomed in portion of $V_{out}$ 520. The middle graph 540 illustrates $V_{in(N)}$ 560 and $V_{in(N+1)}$ 565 and the difference between them, $\delta V_{in}$ 570. The lower graph 550 illustrates $V_{out(N)}$ 580 and $V_{out(N+1)}$ 585 and the difference between them, $\delta V_{out}$ 590. The point at which $\delta V_{out}$ 590 becomes greater than or equal to $\delta V_{in}$ 570 is the rising edge unity gain ($UG_{RE}$) and is circled on the middle and lower graphs 540, 550.

It should be noted that the various embodiments of system 400 noted above with respect to FIGS. 4 and 5 have only discussed rising edges and utilizing the counter 410 and the adder 420 to generate increasing voltages ($V_{in}$) as the counter increased. However, the system 400 is not limited thereby. For example, for rising edges, the system could use a counter and a subtracter to generate $V_{in(N)}$ and $V_{in(N-1)}$ where the voltages still increase as the numbers (N and N−1) increase. When UG was determined the value "N" would be recorded and fed into all I/O buffers to re-generate the UG buffer input voltage as N would be the number that generated the actual input voltage that generated a UG. Alternatively, the voltages generated by the voltage generators could increase as the numbers decreased so that the counter and adder (or subtracter) could start at high numbers and work their way down.

For falling edges (high to low transitions), a counter and a subtracter could be used with the numbers starting high. As the numbers decrease the voltages generated could also decrease. When UG was found N−1 would be stored and used for the other buffers. Alternatively, a counter and adder could be used and then when UG was found N would be stored and used. According to another embodiment, the voltages generated by the voltage generators could decrease as the numbers increased so that the counter and adder (or substractor) could start at low numbers and work their way up. As one of ordinary skill in the art would recognize there are numerous ways to implement system 400 that would within the current scope of the various embodiments described herein.

Figure 6:
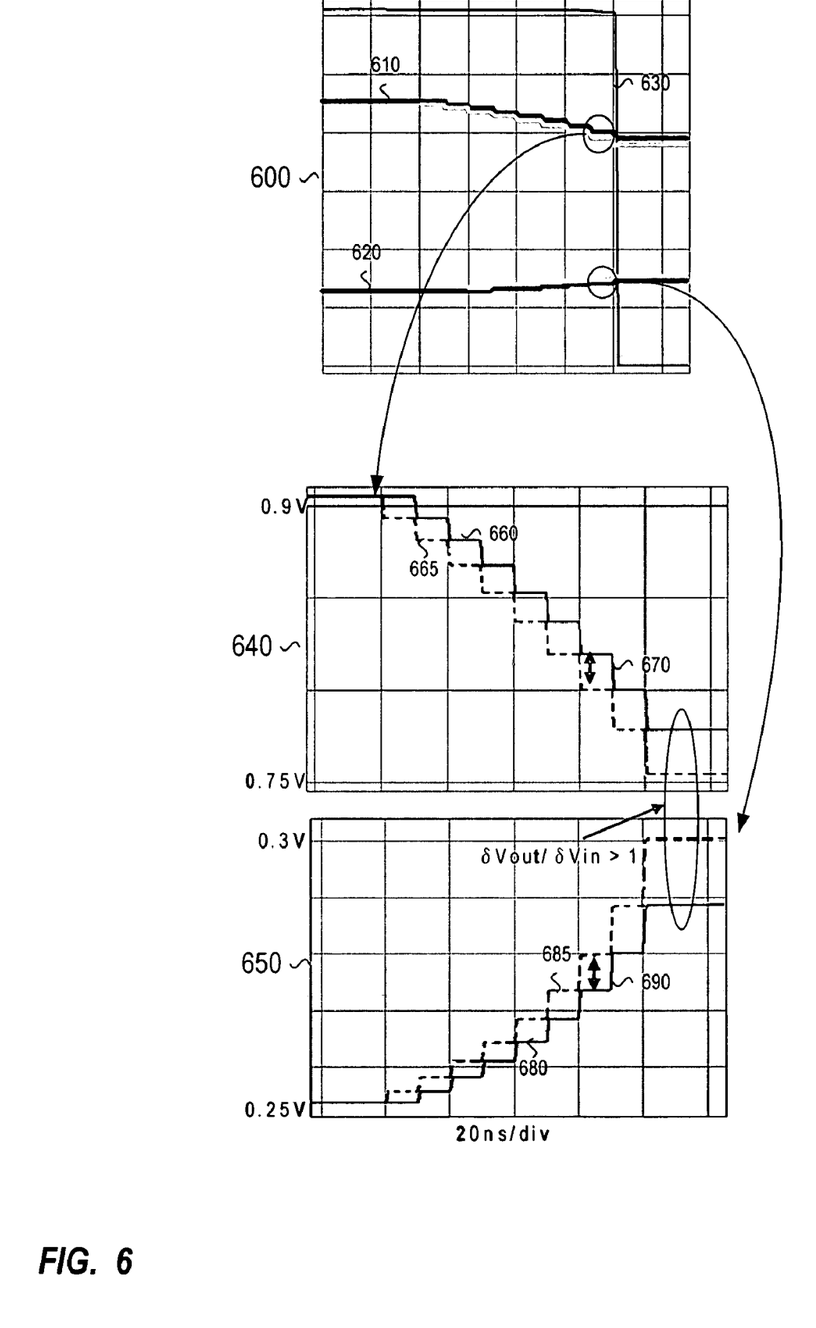
FIG. 6 illustrates an exemplary high to low transition of $V_{in}$ and corresponding low to high transition of $V_{out}$, according to one embodiment.

FIG. 6 illustrates an exemplary high to low transition of $V_{in}$ and corresponding low to high transition of $V_{out}$. An upper graph 600 illustrates $V_{in}$ 610 decreasing and $V_{out}$ 620 increasing. It also illustrates a differential amplifier signal 630 switching from "1" to "0" at a point when $\delta V_{out}$ is greater than or equal to $\delta V_{in}$. Middle graph 640 is a zoomed in portion of $V_{in}$ 610 and lower graph 650 is a zoomed in portion of $V_{out}$ 620. The middle graph 640 illustrates $V_{in(N)}$ 660 and $V_{in(N+1)}$ 665 and the difference between them, $\delta V_{in}$ 670. The lower graph 650 illustrates $V_{out(N)}$ 680 and $V_{out(N+1)}$ 685 and the difference between them, $\delta V_{out}$ 690. The point at which $\delta V_{out}$ 690 becomes greater than or equal to $\delta V_{in}$ 670 is the falling edge unity gain ($UG_{FE}$) and is circled on the middle and lower graphs 640, 650.

Figure 7:
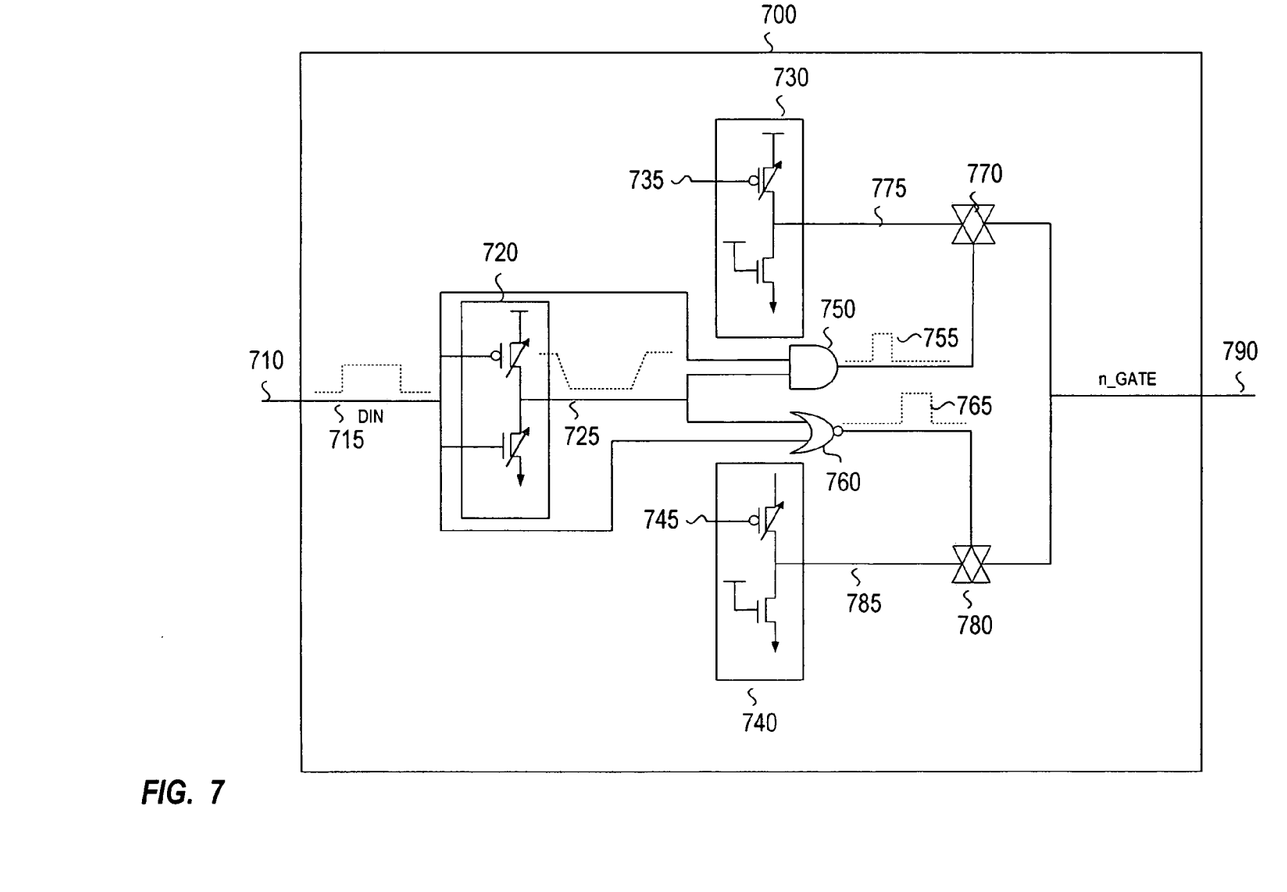
FIG. 7 illustrates an exemplary preboost circuit for an input/output buffer, according to one embodiment.

FIG. 7 illustrates an exemplary preboost compensation circuit 700 for an input/output buffer. The pre-boost compensation circuit 700 includes an input 710 for receiving data, a strength controlled inverter 720, a first voltage generator 730 for generating a UG input voltage for a rising edge, a second voltage generator 740 for generating a UG input voltage for a falling edge, an AND gate 750, a NOR gate 760, a first pass gate 770, a second pass gate 780, and an output 790. Data ($D_{in}$) 715 arrives at the input 710 and rising and falling edges of the $D_{in}$ are inverted by the strength-controlled inverter 720 to generate an inverted data signal ($D_{in\#}$) 725. The inverter 720 is controlled by a variable edge rate setting that tracks PVT variations so that the fall-time and rise-time of the inverted date signal is also PVT compensated. The $D_{in}$ 715 and the $D_{in\#}$ 725 are ANDed together by the AND gate 750 thereby generating a PVT compensated pulse for the $D_{in}$ rising edge ($D_{RE}$) 755. The $D_{in}$ 715 and the $D_{in\#}$ 725 are likewise NORed together by the NOR gate 760 to generate a PVT compensated pulse for the $D_{in}$ falling edge ($D_{FE}$) 765.

The value determined for UG on the rising edge (e.g., $UG_{RE}$ of FIG. 5) 735 is provided as an input to the first voltage generator 730. Accordingly, the first voltage generator 730 generates an input voltage 775 that provides a $UG_{RE}$ ($V_{UG-RE}$). The value determined for UG on the falling edge (e.g., $UG_{FE}$ of FIG. 6) 745 is provided as an input to the second voltage generator 740. Accordingly, the second voltage generator 740 generates an input voltage 785 that provides a $UG_{FE}$ ($V_{UG-FE}$).

The $V_{UG-RE}$ 775 and the $D_{RE}$ 755 are provided to the first pass gate 770. The $D_{RE}$ 755 opens the first pass-gate on the rising edge of $D_{in}$ (when $D_{RE}$ 755 is active (set to "1")) and provides the $V_{UG-RE}$ 775 as the output to the n-gate of the output buffer. That is, the n-gate is boosted to $V_{UG-RE}$ 775 for the rising edge of $D_{in}$. The $V_{UG-FE}$ 785 and the $D_{FE}$ 765 are provided to the second pass gate 780. The $D_{FE}$ 765 opens the second pass-gate on the rising edge of $D_{in}$ (when $D_{FE}$ 765 is active (set to "1")) and provides the $V_{UG-FE}$ 785 as the output to the n-gate of the output buffer. That is, the n-gate is boosted to $V_{UG-FE}$ 785 for the falling edge of $D_{in}$.

Figure 8:
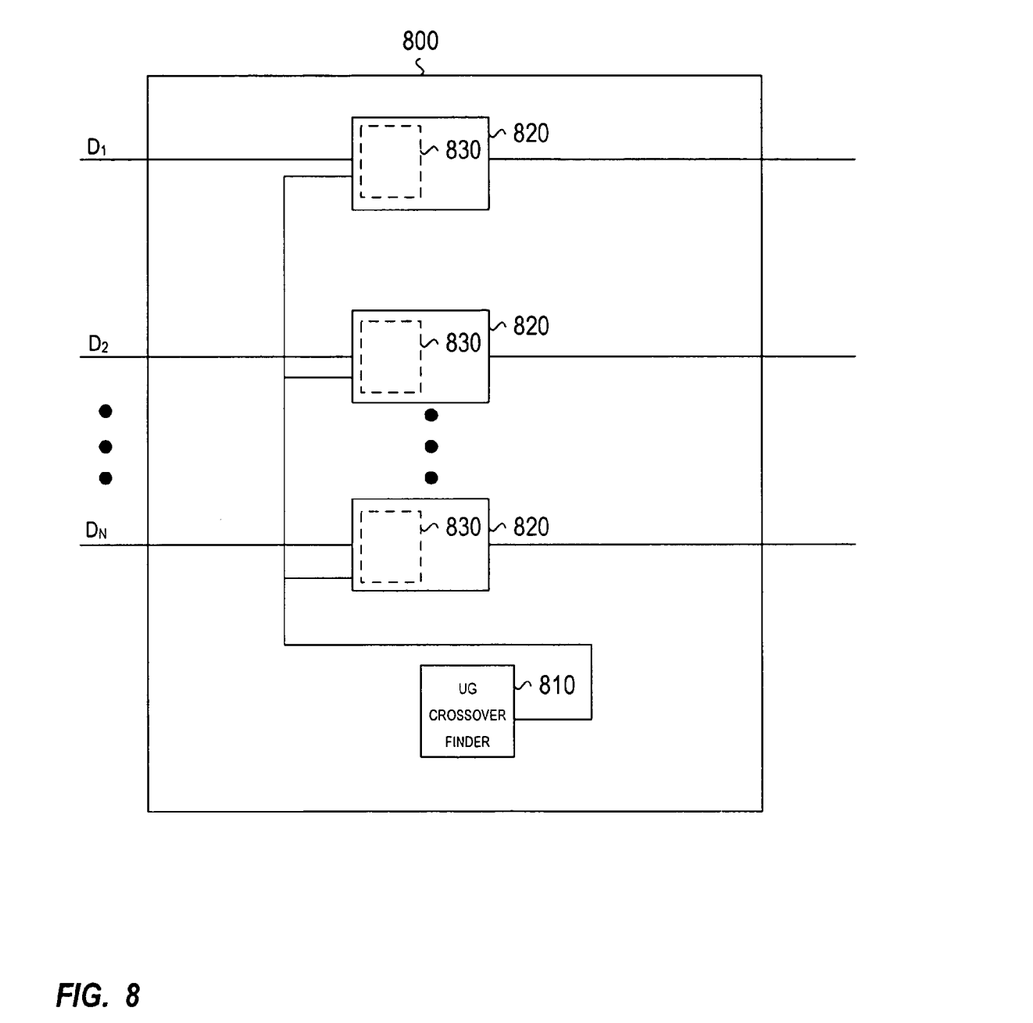
FIG. 8 illustrates a block diagram of an exemplary output buffer utilizing UG crossovers, according to one embodiment.

FIG. 8 illustrates a block diagram of an exemplary output buffer 800 utilizing UG crossovers. The output buffer 800 includes a UG crossover finder 810 and a plurality of input/output buffers 820, each input/output including a pre-boost driver 830. The UG crossover finder 810 (e.g., circuit 400 of FIG. 4) finds values that generate input voltages that generate a UG in an output buffer. The UG crossover finder 810 finds the UG crossover points for both rising and falling edges of the input voltage. The crossover values are provided to the pre-boost drivers 830 for each input/output buffer 820. Accordingly, the unity-gain points of the buffer 800 are re-generated inside each I/O buffer 820 and each input/output is pre-boosted in a fashion that takes into account PVT variations According to one embodiment, the circuit 820 may determine the UG crossover points during power up of the buffer 800 and then provide the values to replica voltage generators within each I/O buffer for use thereafter. According to an alternative embodiment, the circuit 820 may continually track the US crossover points and output the values provided to the I/O buffers 810 on cycles when no data is being received by the buffer 800.

The various embodiments discussed above track output buffer unity-gain irrespective of PVT. As the result, clock-to-output timing ($T_{co}$) is balanced, the edge rate is tightly controlled, and the edge rate is linear near voltage output low ($V_{ol}$) and voltage output high ($V_{oh}$).

Figure 9:
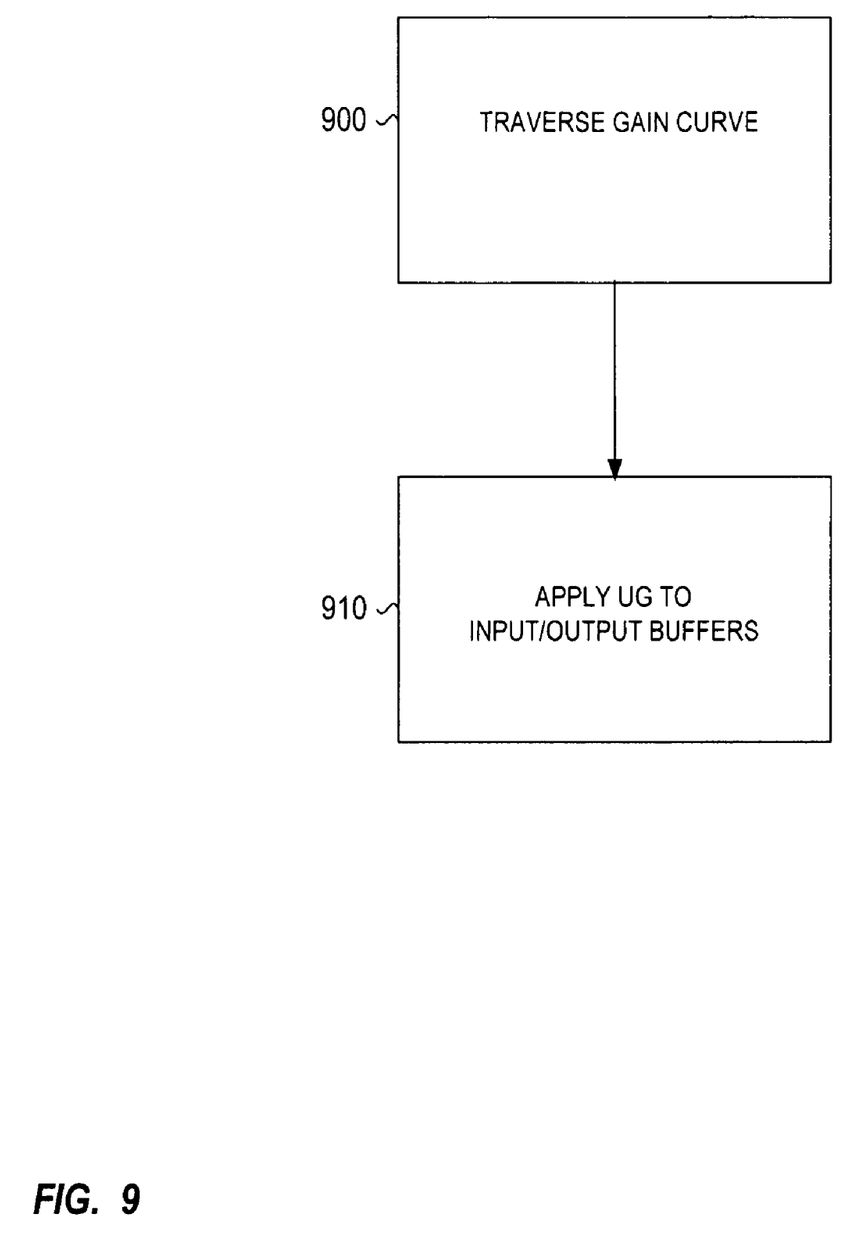
FIG. 9 illustrates an exemplary process flow for pre-boosting an output buffer, according to one embodiment.

FIG. 9 illustrates an exemplary process flow for pre-boosting an output buffer. A gain curve for the output buffer is traversed to find UG crossover points 900. The gain curve is traversed for a rising edge and a falling edge of an input voltage. The UG crossover points are applied to input/output buffers to pre-boost the input data 910. The rising edge UG crossover point is applied to a rising edge of the input data and the falling edge UG crossover point is applied to a falling edge of the input data.

Figure 10:
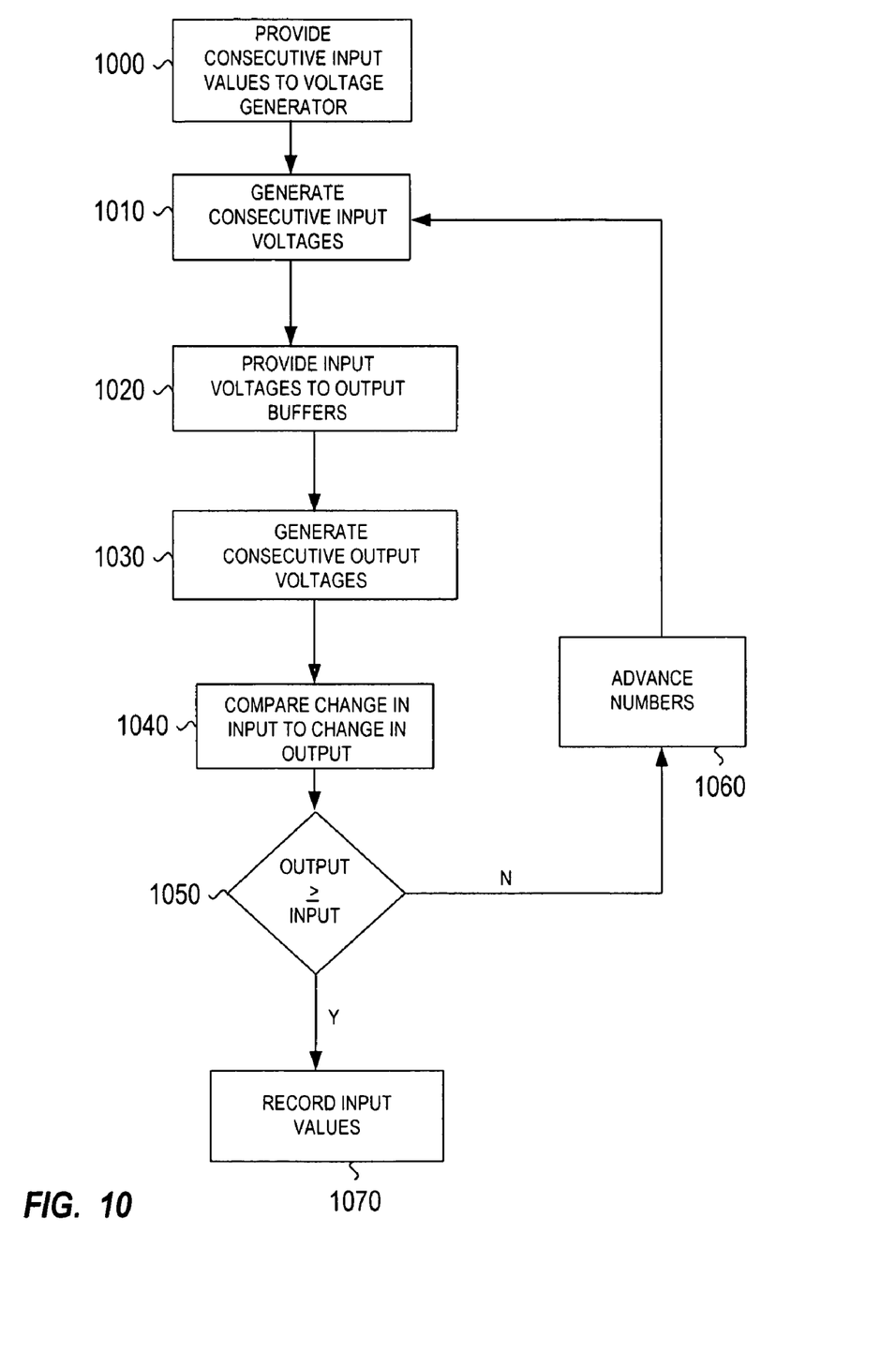
FIG. 10 illustrates an exemplary process flow for traversing a gain curve, according to one embodiment.

FIG. 10 illustrates an exemplary process flow for traversing a gain curve (e.g., 900 of FIG. 9). Consecutive input values are generated and provided to a pair of identical voltage generators 1000. The voltage generators generate consecutive input voltages 1010. The consecutive input voltages are applied to a pair of identical output buffers 1020. The output buffers generate consecutive output voltages 1030. A comparison is made between the change in input voltages and the change in output voltages 1040. A determination is made as to whether the change in output voltages is equal to or greater than the change in input voltages 1050. If the change in output voltages is less than the change in input voltages (1050 No), the input values are advanced 1060 and new input voltages are generated 1010. If the change in output voltages is equal to or greater than the change in input voltages (1050 Yes), the input values are recorded 1070.

Figure 11:
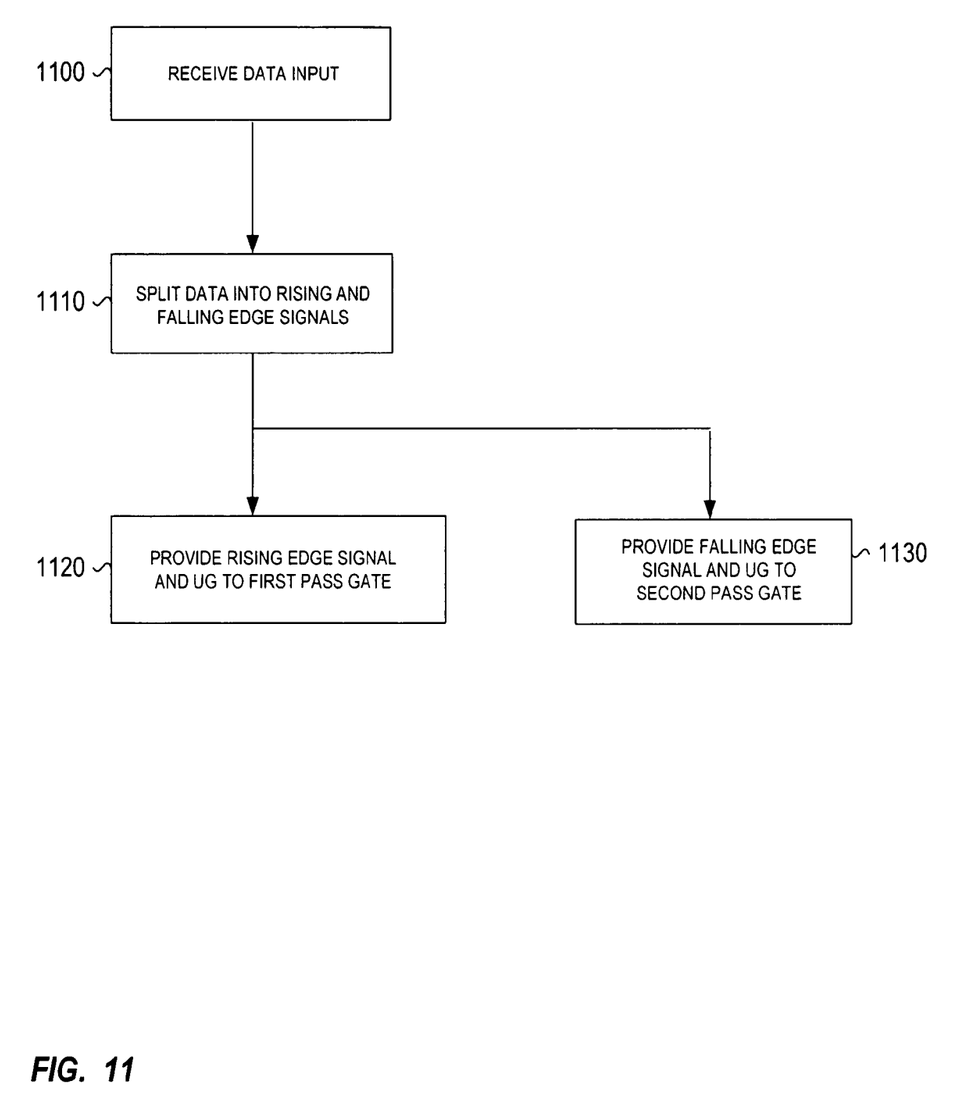
FIG. 11 illustrates an exemplary process flow for applying the UG crossover voltages to input/output buffers, according to one embodiment.

FIG. 11 illustrates an exemplary process flow for applying the UG crossover voltages to input/output buffers (e.g., 910 of FIG. 9). Data input is received by the input/output buffer 1100. The data input is split into a rising edge signal and a falling edge signal 1110. The rising edge signal is applied to a first pass gate along with the rising edge UG voltage 1120. The rising edge voltage is generated by applying the recorded input value that created the UG rising edge voltage when traversing the rising edge gain curve (e.g., 1070 of FIG. 10) to a voltage generator. Likewise the falling edge signal is applied to a second pass gate along with the falling edge UG voltage 1130 (the falling edge UG voltage is generated by applying the recorded falling edge UG crossover value).

The various embodiments described herein could be utilized in a computer system. As one skilled in the art would recognize a computer system includes processor(s) and memory and may interface to periphery, networks, the Internet, and other computer systems. The computer system may include a single die with the processor(s) and memory or may include a processor die and off die memory (e.g., a memory die). The various embodiments may be implemented as part of the memory or part of the processor(s).

Although the various embodiments have been illustrated by reference to specific embodiments, it will be apparent that various changes and modifications may be made. Reference to "one embodiment" or "an embodiment" means that a particular feature, structure or characteristic described in connection with the embodiment is included in at least one embodiment. Thus, the appearances of the phrase "in one embodiment" or "in an embodiment" appearing in various places throughout the specification are not necessarily all referring to the same embodiment.

Different implementations may feature different combinations of hardware, firmware, and/or software. It may be possible to implement, for example, some or all components of various embodiments in software and/or firmware as well as hardware, as known in the art. Embodiments may be implemented in numerous types of hardware, software and firmware known in the art, for example, integrated circuits, including ASICs and other types known in the art, printed circuit broads, components, etc.

The various embodiments are intended to be protected broadly within the spirit and scope of the appended claims.

What is claimed is:

1. An apparatus for pre-boosting an output buffer circuit, the apparatus comprising:
 a unity gain detector to traverse a gain curve of the output buffer circuit to determine unity gain voltages associated with unity gain crossover points on an input voltage ramp; and
 a pre-boost circuit to apply the unity gain voltages to at least one input/output buffer within the output buffer circuit.

2. The apparatus of claim 1, wherein said unity gain detector traverses the gain curve of the output buffer circuit to determine a rising edge voltage associated with a unity gain crossover point on a rising edge of the input voltage ramp and a falling edge voltage associated with a unity gain crossover point on a falling edge of the input voltage.

3. The apparatus of claim 2, wherein said pre-boost circuit
 applies the rising edge voltage to the at least one input/output buffer on a rising edge of data received by the at least one input/out buffer; and
 applies the falling edge voltage to the at least one input/output buffer on a falling edge of data received by the at least one input/out buffer.

4. The apparatus of claim 1, wherein said unity gain detector includes
 an input generator to generate a sequence of consecutive input values;
 a pair of voltage generators to generate a pair of consecutive input voltages based on the sequence of consecutive numbers, wherein a first input voltage is based on a first number and a second input voltage is based on a second number;
 a pair of output buffers to generate a pair of consecutive output voltages based on the pair of consecutive input voltages, wherein a first output voltage is based on the first input voltage and a second output voltage is based on the second input voltage;
 a comparator to compare change in the pair of consecutive input voltages to change in the pair of consecutive output voltages; and
 a control circuit to record input value that causes the change in the pair of consecutive output voltages to be equal or greater than the change in the pair of consecutive input voltages.

5. The apparatus of claim 4, wherein if said comparator determines the change in the pair of consecutive output voltages is less than the change in the pair of consecutive input voltages
 said input generator advances the sequence of consecutive input values;
 said pair of voltage generators generates a next pair of consecutive input voltages;
 said pair of output buffers generates a next pair of consecutive output voltages; and
 said comparator compare change in the next pair of consecutive input voltages to change in the next pair of consecutive output voltages.

6. The apparatus of claim 1, wherein said pre-boost circuit includes
 an inverter to split a data input into a rising edge signal and a falling edge signal;
 a first voltage generator to generate a rising edge unity gain voltage;
 a second voltage generator to generate a falling edge unity gain voltage;
 a first pass gate to provide to receive the rising edge signal and the rising edge unity gain voltage, and to apply the rising edge unity gain voltage to the at least one input/output buffer when the rising edge signal is active; and
 a second pass gate to provide to receive the falling edge signal and the falling edge unity gain voltage, and to apply the falling edge unity gain voltage to the at least one input/output buffer when the falling edge signal is active.

7. A method comprising:
 traversing a gain curve of an output buffer circuit to determine unity gain voltages associated with unity gain crossover points on an input voltage ramp; and
 applying the unity gain voltages to at least one input/output buffer within the output buffer circuit.

8. The method of claim 7, wherein said traversing includes traversing the gain curve of the output buffer circuit to determine a rising edge voltage associated with a unity gain crossover point on a rising edge of the input voltage ramp and a falling edge voltage associated with a unity gain crossover point on a falling edge of the input voltage.

9. The method of claim 8, wherein said applying includes
 applying the rising edge voltage to the at least one input/output buffer on a rising edge of data received by the at least one input/out buffer; and
 applying the falling edge voltage to the at least one input/output buffer on a falling edge of data received by the at least one input/out buffer.

10. The method of claim 7, wherein said traversing includes
 providing a sequence of consecutive input values to a pair of voltage generators;
 generating a pair of consecutive input voltages;
 providing the pair of consecutive input voltages to a pair of output buffers;
 generating a pair of consecutive output voltages;
 comparing change in the pair of consecutive input voltages to change in the pair of consecutive output voltages; and
 recording input value that causes the change in the pair of consecutive output voltages to be equal or greater than the change in the pair of consecutive input voltages.

11. The method of claim 10, wherein said traversing further includes advancing the sequence of consecutive input values if the change in the pair of consecutive output voltages is less than the change in the pair of consecutive input voltages and repeating said generating a pair of consecutive input voltages, said providing the pair of consecutive input voltages, said generating a pair of consecutive output voltages, and said comparing.

12. The method of claim 7, wherein said applying further comprises receiving a data input;
 splitting the data input into a rising edge signal and a falling edge signal;
 providing the rising edge signal and a rising edge unity gain voltage to a first pass gate, wherein the first pass gate will apply the rising edge unity gain voltage to the at least one input/output buffer when the rising edge signal is active; and
 providing the falling edge signal and a falling edge unity gain voltage to a second pass gate, wherein the second pass gate will apply the falling edge unity gain voltage to the at least one input/output buffer when the rising edge signal is active.

13. A computer comprising:
a processor die including
- a unity gain detector to traverse a gain curve of an output buffer circuit to determine unity gain voltages associated with unity gain crossover points on an input voltage ramp; and
- a pre-boost circuit to apply the unity gain voltages to at least one input/output buffer within the output buffer circuit; and an off die memory device.

14. The computer of claim 13, wherein the unity gain detector includes
- an input generator to generate a sequence of consecutive input values;
- a pair of voltage generators to generate a pair of consecutive input voltages based on the sequence of consecutive numbers, wherein a first input voltage is based on a first number and a second input voltage is based on a second number;
- a pair of output buffers to generate a pair of consecutive output voltages based on the pair of consecutive input voltages, wherein a first output voltage is based on the first input voltage and a second output voltage is based on the second input voltage;
- a comparator to compare change in the pair of consecutive input voltages to change in the pair of consecutive output voltages; and
- a control circuit to record input value that causes the change in the pair of consecutive output voltages to be equal or greater than the change in the pair of consecutive input voltages.

15. The computer of claim 13, wherein the pre-boost circuit includes
- an inverter to split a data input into a rising edge signal and a falling edge signal;
- a first voltage generator to generate a rising edge unity gain voltage;
- a second voltage generator to generate a falling edge unity gain voltage;
- a first pass gate to provide to receive the rising edge signal and the rising edge unity gain voltage, and to apply the rising edge unity gain voltage to the at least one input/output buffer when the rising edge signal is active; and
- a second pass gate to provide to receive the falling edge signal the falling edge unity gain voltage, and to apply the falling edge unity gain voltage to the at least one input/output buffer when the falling edge signal is active.

* * * * *